United States Patent
Nishigaki et al.

(10) Patent No.: US 10,459,037 B2
(45) Date of Patent: Oct. 29, 2019

(54) STATE-OF-CHARGE ESTIMATION DEVICE AND STATE-OF-CHARGE ESTIMATION METHOD

(71) Applicant: KABUSHIKI KAISHA TOYOTA JIDOSHOKKI, Aichi (JP)

(72) Inventors: Kenji Nishigaki, Kariya (JP); Masashi Kidono, Kariya (JP); Takahiro Tsuzuku, Kariya (JP); Hiroyuki Nomura, Kariya (JP)

(73) Assignee: KABUSHIKI KAISHA TOYOTA JIDOSHOKKI, Aichi (JP)

( * ) Notice: Subject to any disclaimer, the term of this patent is extended or adjusted under 35 U.S.C. 154(b) by 561 days.

(21) Appl. No.: 14/766,538

(22) PCT Filed: Feb. 10, 2014

(86) PCT No.: PCT/JP2014/053010
§ 371 (c)(1),
(2) Date: Aug. 7, 2015

(87) PCT Pub. No.: WO2014/126029
PCT Pub. Date: Aug. 21, 2014

(65) Prior Publication Data
US 2015/0369871 A1   Dec. 24, 2015

(30) Foreign Application Priority Data
Feb. 15, 2013   (JP) .................. 2013-027277

(51) Int. Cl.
*G01R 31/36* (2019.01)
*G01R 31/3842* (2019.01)
(Continued)

(52) U.S. Cl.
CPC ..... *G01R 31/3842* (2019.01); *G01R 31/3648* (2013.01); *H01M 10/425* (2013.01);
(Continued)

(58) Field of Classification Search
None
See application file for complete search history.

(56) References Cited

U.S. PATENT DOCUMENTS 6,232,744 B1 * 5/2001 Kawai ............... B60K 6/28
180/65.235
2002/0113595 A1 * 8/2002 Sakai ............... B60K 6/445
324/433

(Continued)

FOREIGN PATENT DOCUMENTS

JP   2000-312404   11/2000
JP   2002-238106   8/2002

(Continued)

OTHER PUBLICATIONS

International Search Report, dated May 20, 2014, for the corresponding International Application No. PCT/JP2014/053010.

*Primary Examiner* — Robert Grant
*Assistant Examiner* — Tynese V McDaniel
(74) *Attorney, Agent, or Firm* — Greenblum & Bernstein, P.L.C.

(57) ABSTRACT

A state-of-charge estimation device includes a transition estimation unit, when a transition from a charge mode to a discharge mode starts, which starts current integration by use of a measured current and obtains a second state of charge by use of a first state of charge at the start of the transition and a current integration value, so as to estimate that the second state of charge is a state of charge upon transition until a target state of charge is reached that is determined by a current integration value obtained for a predetermined time period after the start of the transition, and/or when a transition from a discharge mode to a charge mode starts, which starts current integration by use of a (Continued)

measured current and obtains a sixth state of charge by use of a third state of charge at the start of the transition and a current integration value.

10 Claims, 6 Drawing Sheets

(51) Int. Cl.
*H01M 10/48* (2006.01)
*H01M 10/42* (2006.01)
*H02J 7/00* (2006.01)
*G01R 31/382* (2019.01)

(52) U.S. Cl.
CPC .......... *H01M 10/48* (2013.01); *H02J 7/0047* (2013.01); *G01R 31/382* (2019.01); *H02J 2007/005* (2013.01)

(56) References Cited

U.S. PATENT DOCUMENTS

| | | | |
|---|---|---|---|
| 2006/0091862 A1* | 5/2006 | Melichar | G01R 31/3648 320/132 |
| 2011/0033735 A1* | 2/2011 | Kinoshita | H01M 10/052 429/90 |
| 2012/0166116 A1* | 6/2012 | Yoshida | G01R 31/3624 702/63 |
| 2013/0190958 A1* | 7/2013 | Izumi | B60W 20/20 701/22 |
| 2014/0320141 A1* | 10/2014 | Kaburagi | H01M 10/48 324/426 |
| 2015/0369873 A1* | 12/2015 | Nakao | G01R 31/3606 702/63 |

FOREIGN PATENT DOCUMENTS

| | | |
|---|---|---|
| JP | 2012-137408 | 7/2012 |
| JP | 2012-247374 | 12/2012 |
| WO | 2013/069459 | 5/2013 |

* cited by examiner

F I G. 1

F I G. 2

401

| CCV UPON CHARGING | FIRST STATE OF CHARGE SOC [%] |
|---|---|
| cm00 | 0 |
| cm01 | 5 |
| cm02 | 10 |
| cm03 | 15 |
| cm04 | 20 |
| cm05 | 25 |
| cm06 | 30 |
| ⋮ | ⋮ |
| cm17 | 85 |
| cm18 | 90 |
| cm19 | 95 |
| cm20 | 100 |

F I G. 3 A

402

| CCV UPON DISCHARGING | THIRD STATE OF CHARGE SOC [%] |
|---|---|
| dm00 | 0 |
| dm01 | 5 |
| dm02 | 10 |
| dm03 | 15 |
| dm04 | 20 |
| dm05 | 25 |
| dm06 | 30 |
| ⋮ | ⋮ |
| dm17 | 85 |
| dm18 | 90 |
| dm19 | 95 |
| dm20 | 100 |

F I G. 3 B

| CURRENT LOAD | $\Delta$SOC [%] |
|---|---|
| 0.1C | 15 |
| 0.2C | 13 |
| 0.5C | 10 |
| 0.7C | 9 |
| 1.0C | 8 |
| 2.0C | 5 |

STATE-OF-CHARGE ESTIMATION DEVICE AND STATE-OF-CHARGE ESTIMATION METHOD

FIELD

The present invention relates to a state-of-charge estimation device and a state-of-charge estimation method which estimate a state of charge.

BACKGROUND

Estimating an open circuit voltage (OCV) by use of a measured closed circuit voltage (CCV) so as to estimate a state of charge (SOC) by use of the open circuit voltage is a known method for estimating a state of charge in a battery.

However, for a secondary battery which requires a long time until polarization is dissipated, it is difficult to estimate a state of charge accurately from an open circuit voltage because the battery has a large hysteresis upon charging/discharging in its SOC-OCV characteristics. A secondary battery in which, for example, SiO (silicon monoxide) is used for a negative electrode is a known secondary battery requiring a long time until polarization is dissipated.

A remaining secondary-battery capacity calculating device which has a simple and compact configuration and is able to accurately detect a remaining capacity in a secondary battery in which a flat region of the charge/discharge voltage is large is a known technology for estimating a state of charge. The remaining capacity calculating device weights, according to a rate of change in charge/discharge voltage, a charge/discharge voltage corresponding to the remaining capacity by use of a first remaining capacity obtained on the basis of a charge/discharge voltage or a second remaining capacity obtained on the basis of a charge/discharge-current integration value. In other words, even if a characteristic curve of the charge/discharge voltage is flat, the characteristic curve of the charge/discharge voltage gains a slope as a result of at least weighting the charge/discharge voltage by use of the second remaining capacity obtained on the basis of a charge/discharge-current integration value, which permits obtaining of an accurate remaining capacity in a secondary battery.

Patent Document 1: Japanese Laid-open Patent Publication No. 2012-137408

SUMMARY

The present invention has been accomplished in light of the problem described above, and an object of the invention is to provide a state-of-charge estimation device and a state-of-charge estimation method which accurately estimate a state of charge in a battery even if the state of charge is influenced by polarization.

According to an aspect of the invention, a state-of-charge estimation device includes a voltage measuring unit, a current measuring unit, a charge estimation unit, a transition estimation unit, and a discharge estimation unit.

The voltage measuring unit measures a voltage in a battery. The current measuring unit measures a current charged to and discharged from the battery.

In a charge mode, the charge estimation unit refers, by use of a measured closed circuit voltage, to charge mode information that associates a closed circuit voltage with a first state of charge in the battery when charging is performed by a charger, and obtains the first state of charge, so as to estimate that the first state of charge is a state of charge upon charging.

When a transition from the charge mode to a discharge mode starts, the transition estimation unit starts current integration by use of the measured current. After that, the transition estimation unit obtains a second state of charge by use of the first state of charge at the start of the transition and a current integration value, so as to estimate that the second state of charge is a state of charge upon transition until a target state of charge is reached that is determined by a current integration value obtained for a predetermined time period after the start of the transition.

When the discharge mode starts after the transition is over, the discharge estimation unit refers, by use of the measured closed circuit voltage, to discharge mode information that associates a closed circuit voltage generated by use of a discharge pattern of the battery obtained by operating a vehicle in a predetermined operation pattern with a third state of charge in the battery, and obtains the third state of charge, so as to estimate that the third state of charge is a state of charge upon discharging.

According to another aspect of the invention, a state-of-charge estimation device includes a voltage measuring unit, a current measuring unit, a discharge estimation unit, a transition estimation unit, and a charge estimation unit.

The voltage measuring unit measures a voltage in a battery. The current measuring unit measures a current charged to and discharged from the battery.

In a discharge mode, the discharge estimation unit refers, by use of a measured closed circuit voltage, to discharge mode information that associates a closed circuit voltage generated by use of a discharge pattern of the battery obtained by operating a vehicle in a predetermined operation pattern with a third state of charge in the battery, and obtains the third state of charge, so as to estimate that the third state of charge is a state of charge upon discharging.

When a transition from the discharge mode to a charge mode starts, the transition estimation unit starts current integration by use of the measured current. After that, the transition estimation unit obtains a sixth state of charge by use of the third state of charge at the start of the transition and a current integration value, so as to estimate that the sixth state of charge is a state of charge upon transition until a target state of charge is reached that is determined by a current integration value obtained for a predetermined time period after the start of the transition.

When the charge mode starts after the transition is over, the charge estimation unit refers, by use of the measured closed circuit voltage, to charge mode information that associates a closed circuit voltage with a first state of charge in the battery when charging is performed by a charger, and obtains the first state of charge, so as to estimate that the first state of charge is a state of charge upon charging.

According to embodiments of the present invention, an advantage is provided such that a state of charge in a battery is estimated accurately even if the state of charge is influenced by polarization.

DESCRIPTION OF EMBODIMENTS

Embodiments of the present invention will now be described in detail with reference to the drawings.

A first embodiment will now be described.

Figure 1:
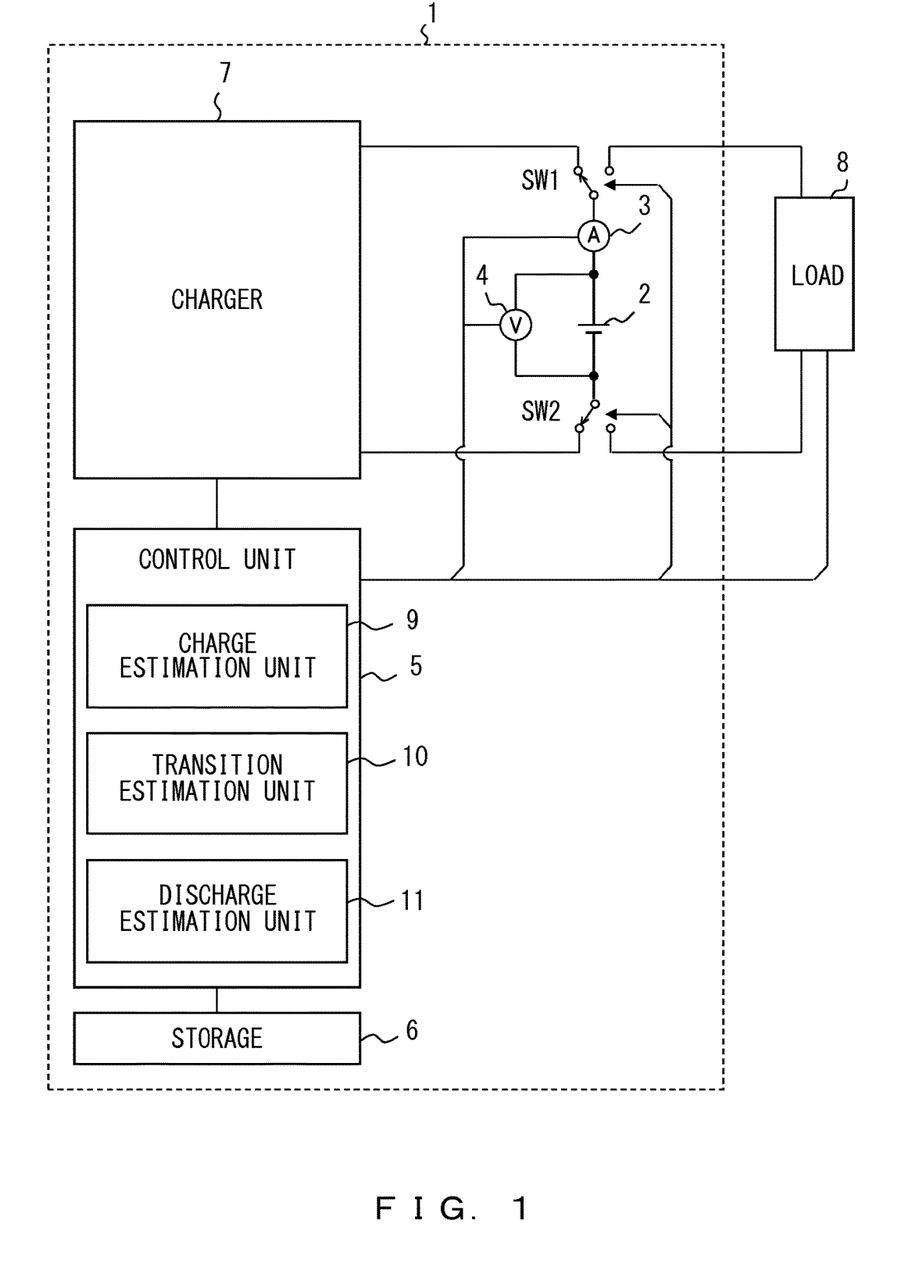
FIG. 1 is an example of a charging/discharging apparatus.

FIG. 1 is an example of a charging/discharging apparatus. The charging/discharging apparatus in FIG. 1 has a state-of-charge estimation device and includes, for example, a battery 2, a current measuring unit 3, a voltage measuring unit 4, a control unit 5, a storage 6, a charger 7, and switches SW1 and SW2. A load 8 in FIG. 1 is a device that is operable by receiving power from the charging/discharging apparatus 1. For example, the operable device may be a motor equipped on a vehicle.

The state-of-charge estimation device includes, for example, the current measuring unit 3, the voltage measuring unit 4, the control unit 5, the storage 6, and the switches SW1 and SW2.

The battery 2 may be a battery which has polarization. In this embodiment, a secondary battery having a large polarization, requiring a long time for depolarization, and having a large charge/discharge hysteresis, will be described for convenience. It may be, for example, a lithium-ion secondary battery in which a SiO negative electrode is used as a negative electrode. However, it is not limited to a lithium-ion secondary battery in which SiO is used for a negative electrode. For example, the present invention may be applicable to a conventional secondary battery in which a carbon negative electrode is used as a negative electrode if the temperature is low because such a conventional secondary battery has polarization if the temperature is low.

FIG. 1 describes an example of using one battery, but it is not limited to one battery, and a plurality of batteries may be used.

The current measuring unit 3 measures a current charged to and discharged from the battery 2. It may be, for example, an ammeter. Data measured by the current measuring unit 3 is output to the control unit 5.

The voltage measuring unit 4 measures a voltage in the battery 2. It may be, for example, a voltmeter. Data measured by the voltage measuring unit 4 is output to the control unit 5.

A CPU (central processing unit), a multicore CPU, a programmable device (field programmable gate array, FPGA), and/or PLD (programmable logic device) may be used to configure the control unit 5 (such as a computer).

The storage 6 may be a memory or a hard disk such as a read only memory (ROM) and a random access memory (RAM). The storage 6 may store thereon data such as a parameter value and a variable value, or may be used as a work area upon execution. The storage 6 may not be used when the control unit 5 has a storage.

The charger 7 is a device which receives power from a power supply device to charge the battery 2.

The switches SW1 and SW2 switch charging and discharging according to an instruction from the control unit 5, in which a relay may be used, for example. According to this embodiment, the two switches, SW1 and SW2, are used to switch between charging and discharging, but embodiments are not limited to the circuit illustrated in FIG. 1.

The control unit will now be described.

The control unit 5 has a charge estimation unit 9, a transition estimation unit 10, and a discharge estimation unit 11, and estimates states of charge by use of closed circuit voltages measured upon charging and discharging, respectively. The transition estimation unit 10 includes at least one of a first processor and a second processor which will be described below.

A method for estimating a state of charge upon transition from a charge mode to a discharge mode will now be described.

The charge estimation unit 9 refers, by use of the measured closed circuit voltage, to charge mode information described below that associates a closed circuit voltage with a first state of charge in the battery 2 when constant current charging is performed by the charger 7, and obtains the first state of charge, so as to use the first state of charge as a state of charge upon charging.

When a transition from a charge mode to a discharge mode starts, the first processor included in the transition estimation unit 10 starts current integration by use of the measured current. After that, the transition estimation unit 10 obtains a second state of charge by use of the first state of charge at the start of the transition and a current integration value. Further, the transition estimation unit 10 obtains a current integration value for a predetermined time period, so as to use the second state of charge as a state of charge upon transition until a target state of charge is reached that is associated with the obtained current integration value.

When the discharge mode starts after the transition is over, the discharge estimation unit 11 refers, by use of the measured closed circuit voltage, to discharge mode information described below that associates a closed circuit voltage generated by use of a discharge pattern of the battery 2 obtained by operating a vehicle in a predetermined operation pattern with a third state of charge in the battery, and obtains the third state of charge, so as to use the third state of charge as a state of charge upon discharging.

A method for estimating a state of charge upon transition from a discharge mode to a charge mode will now be described.

The discharge estimation unit 11 refers to discharge mode information described below by use of the measured closed circuit voltage and obtains a third state of charge, so as to use the third state of charge as a state of charge upon discharging.

When a transition from a discharge mode to a charge mode starts, the second processor included in the transition estimation unit 10 starts current integration by use of the measured current. After that, the transition estimation unit 10 obtains a sixth state of charge by use of the third state of charge at the start of the transition and a current integration value. Further, the transition estimation unit 10 obtains a current integration value for a predetermined time period, so as to use the sixth state of charge as a state of charge upon transition until a target state of charge is reached that is associated with the obtained current integration value.

When the charge mode starts after the transition is over, the charge estimation unit 9 refers to charge mode information described below by use of the measured closed circuit voltage and obtains a first state of charge, so as to use the first state of charge as a state of charge upon charging.

Figure 2:
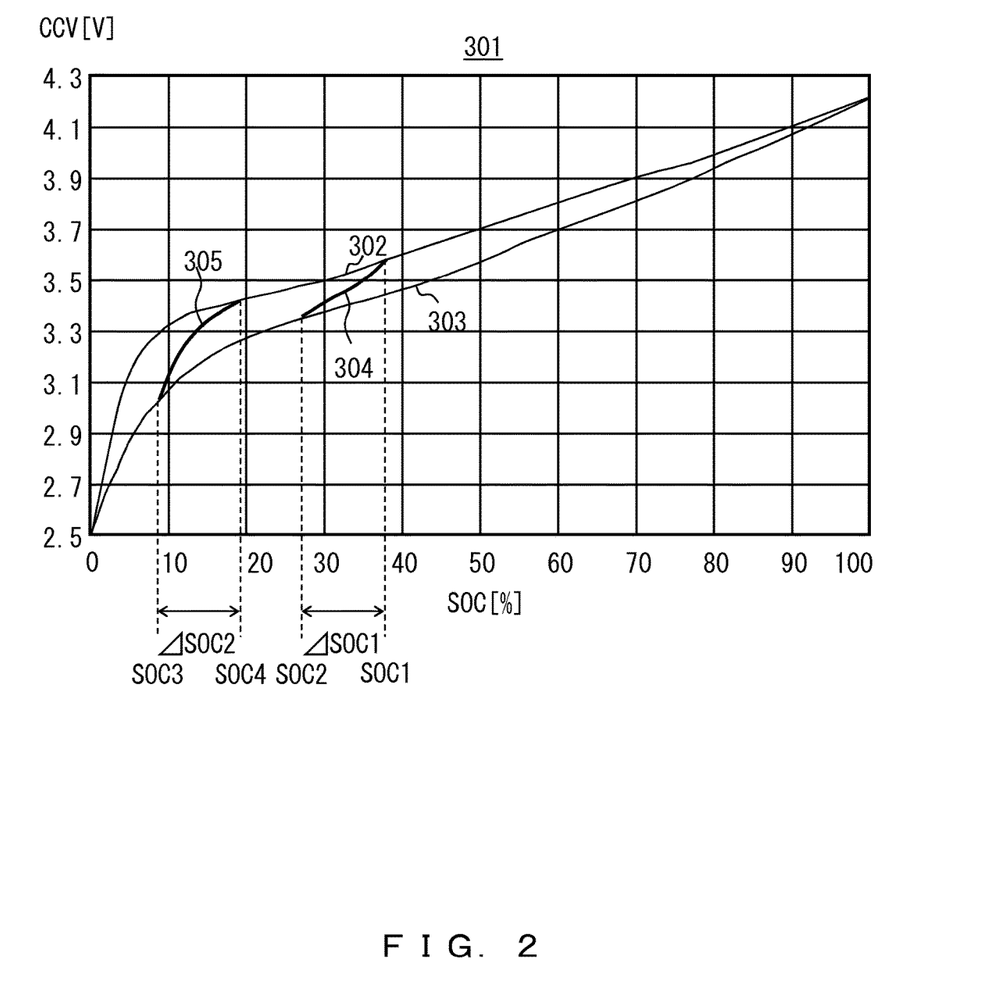
FIG. 2 is a graph which represents an example of SOC-CCV characteristics upon charging/discharging.
Figure 3A:
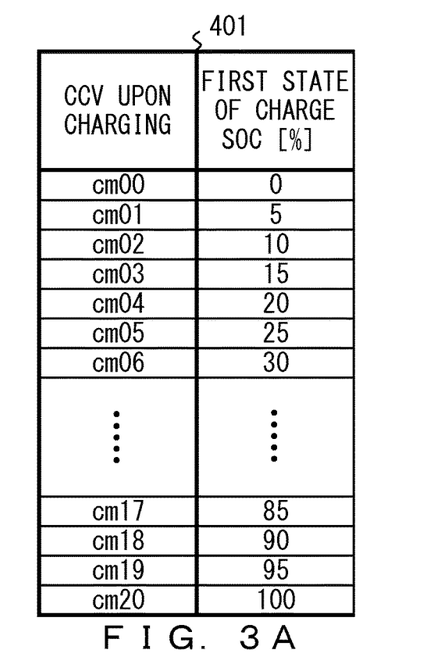
FIG. 3A is a table which represents an example of a data structure of charge mode information.
Figure 3B:
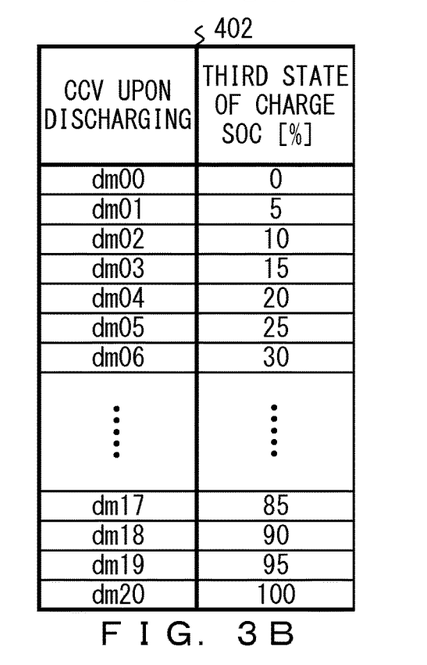
FIG. 3B is a table which represents an example of a data structure of discharge mode information.

FIG. 2 is a graph which represents an example of SOC-CCV characteristics upon charging/discharging. FIGS. 3A and 3B are tables which represent examples of data structures of charge mode information and discharge mode information.

A curve 302 in the graph 301 in FIG. 2 which represents SOC-CCV characteristics depicts a relationship between a closed circuit voltage and a state of charge in the battery 2 when constant current charging is performed by the charger 7. The relationship between a closed circuit voltage and a state of charge in a charge mode is obtained by, for example, an experiment or a simulation.

The charge mode information 401 in FIG. 3A includes information stored in "CCV UPON CHARGING" for a closed circuit voltage upon charging and in "FIRST STATE OF CHARGE SOC [%]" for a state of charge corresponding to the closed circuit voltage. According to this embodiment, "CCV UPON CHARGING" stores therein information representing closed circuit voltages "cm00", "cm01", "cm02", "cm03", "cm04", "cm05", "cm06" . . . "cm17", "cm18", "cm19", and "cm20". According to this embodiment, "FIRST STATE OF CHARGE SOC [%]" stores therein information representing states of charge "0", "5", "10", "15", "20", "25", "30" . . . "85", "90", "95", and "100" in association with the closed circuit voltages.

The curve 302 in the graph 301 and the charge mode 401 in FIG. 3A do not only represent the relationship between a closed circuit voltage and a state of charge in the battery 2 when constant current charging is performed by the charger 7. They may represent, for example, a relationship when constant power charging is performed by the charger 7.

A curve 303 in the graph 301 represents a relationship between a closed circuit voltage generated by use of a discharge pattern of the battery 2 obtained by operating, for example, a vehicle in a predetermined operation pattern and a state of charge.

The predetermined operation pattern may be, for example, the JC-08 mode or the LA#4 mode, which is a method for measuring fuel efficiency by a traveling pattern when the vehicle is an electric vehicle (EV) or a plug-in hybrid vehicle (PHV). When the vehicle is a forklift, a predetermined traveling pattern or working pattern may be used.

The discharge pattern is a pattern of a closed circuit voltage upon discharging in a battery, such as the battery 2, equipped on a vehicle, when the vehicle is operated in a travelling pattern or a working pattern. A relationship between a closed circuit voltage and a state of charge in a discharge mode is obtained by an experiment or a simulation by use of the closed circuit voltage upon discharging.

The discharge mode information 402 in FIG. 3B includes information stored in "CCV UPON DISCHARGING" for a closed circuit voltage upon discharging and "STATE OF CHARGE SOC [%]" for a state of charge corresponding to the closed circuit voltage. According to this embodiment, "CCV UPON DISCHARGING" stores therein information representing closed circuit voltages "dm00", "dm01", "dm02", "dm03", "dm04", "dm05", "dm06" . . . "dm17", "dm18", "dm19", and "dm20". According to this embodiment, "THIRD STATE OF CHARGE SOC [%]" stores therein information representing states of charge "0", "5", "10", "15", "20", "25", "30" . . . "85", "90", "95", and "100" in association with the closed circuit voltages.

A curve 304 in FIG. 2 will now be described.

The curve 304 in FIG. 2 represents a state of charge which the transition estimation unit 10 estimates upon transition from a charge mode to a discharge mode by use of the first state of charge SOC 1 at the start of the transition and a current integration value (second state of charge). The transition estimation unit 10 estimates that the second state of charge is a state of charge during a transition time period until a target state of charge SOC 2 (SOC 1 (first state of charge)−Δ SOC 1 (fourth state of charge)) is reached that is associated with a current integration value obtained for a predetermined time period. The target state of charge SOC 2 is obtained by subtracting Δ SOC 1 from SOC 1 when transitioning from a charge mode to a discharge mode.

The predetermined time period is set within a transition time period from the start to the end of the transition (a time period to transition from the start of the transition to the estimation of a state of charge by use of discharge mode information) and is shorter than the transition time period. For example, the predetermined time period may be a time period of ten seconds from the start of the transition. However, it is not limited to ten seconds.

Next, the current integration value obtained for a predetermined time period is, for example, an integration value of a current discharged during a time period of ten seconds from the start of the transition.

Δ SOC 1 is a state of charge to determine the target state of charge SOC 2 (fourth state of charge). For example, discharge mode transition information that associates information representing a current load upon discharging stored in the storage 6 with information representing Δ SOC, is referred to, so as to obtain Δ SOC 1.

The current load upon discharging may be, for example, a discharge rate. The discharge rate may be obtained by use of a predetermined time period, a current integration value obtained for the predetermined time period, and a full capacity of the battery 2.

For example, if the predetermined time period is ten seconds and the integration value of a current discharged during the time period of ten seconds is 0.02778 [Ah], the integration value of a current to be discharged during the next one hour is estimated to be 10.008 [Ah]=0.0278× (3600±10). Thus, if the full capacity of the battery 2 is 20 [Ah], the discharge rate for the predetermined time period is 0.5 C←10/20.

A curve 305 in FIG. 2 will now be described.

The curve 305 in FIG. 2 represents a state of charge which the transition estimation unit 10 estimates upon transition from a discharge mode to a charge mode by use of the third state of charge SOC 3 at the start of the transition and a current integration value (sixth state of charge). The transition estimation unit 10 estimates that the sixth state of charge is a state of charge during a transition time period until a target state of charge SOC 4 (SOC 3 (third state of charge)+Δ SOC 2 (fifth state of charge)) is reached that is associated with a current integration value obtained for a predetermined time period. The target state of charge SOC 4 is obtained by adding Δ SOC 2 to SOC 3 when transitioning from a discharge mode to a charge mode.

The predetermined time period is set within a transition time period from the start to the end of the transition (a time period to transition from the start of the transition to the estimation of a state of charge by use of charge mode information) and is shorter than the transition time period. For example, the predetermined time period may be a time period of ten seconds from the start of the transition. However, it is not limited to ten seconds.

Next, the current integration value obtained for a predetermined time period is, for example, an integration value of a current during a time period of ten seconds from the start of the transition.

Δ SOC 2 is a state of charge to determine the target state of charge SOC 4 (fifth state of charge). For example, charge mode transition information that associates information representing a current load upon charging stored in the storage 6 with information representing Δ SOC, is referred to, so as to obtain Δ SOC 2.

The current load upon charging may be, for example, a charge rate. The charge rate may be obtained by use of a predetermined time period, a current integration value obtained for the predetermined time period, and a full capacity of the battery 2.

For example, if the predetermined time period is ten seconds and the integration value of a current charged during the time period of ten seconds is 0.02778 [Ah], the integration value of a current to be charged during the next one hour is estimated to be 10.008 [Ah]=0.0278×(3600÷10). Thus, if the full capacity of the battery 2 is 20 [Ah], the charge rate for the predetermined time period is 0.5 C←10/20.

Figure 4:
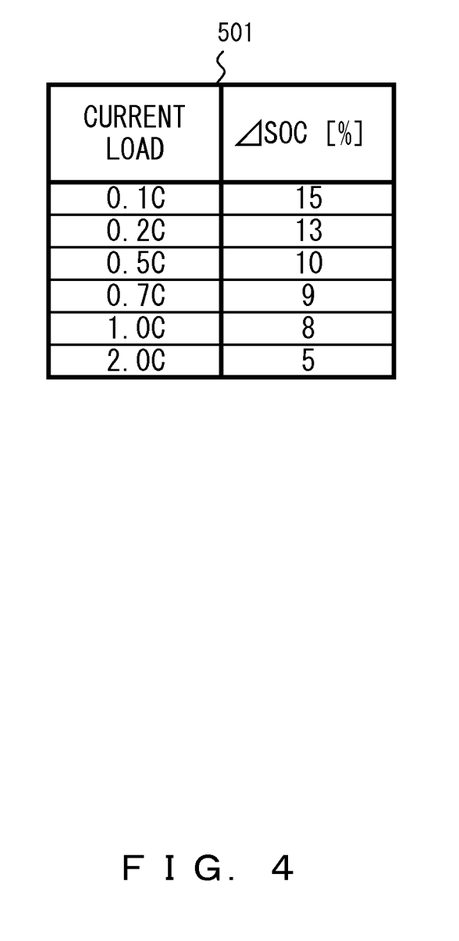
FIG. 4 is a table which represents an example of a data structure of discharge mode transition information or charge mode transition information.

FIG. 4 is a table which represents an example of a data structure of discharge mode transition information or charge mode transition information. Information 501 which represents the discharge mode transition information or the charge mode transition information in FIG. 4 stores therein information to be stored in "CURRENT LOAD" and "Δ SOC [%]". According to this embodiment, "CURRENT LOAD" stores therein discharge rates "0.1 C", "0.2 C", "0.5 C", "0.7 C", "1.0 C", and "2.0 C". According to this embodiment, "Δ SOC [%]" stores therein Δ SOCs "15", "13", "10", "9", "8", and "5" in association with the information stored in "CURRENT LOAD". For example, when transitioning from a charge mode to a discharge mode, Δ SOC 1 is 10% if the discharge mode transition information is referred to and a discharge rate for a predetermined time period is 0.5 C. Δ SOC 2 can be obtained in the same way.

While in this embodiment, the discharge mode transition information and the charge mode transition information are the same, the information stored in the discharge mode transition information and the information stored in the charge mode transition information may be different.

An operation of the control unit (operation of first processing) will now be described.

Figure 5:
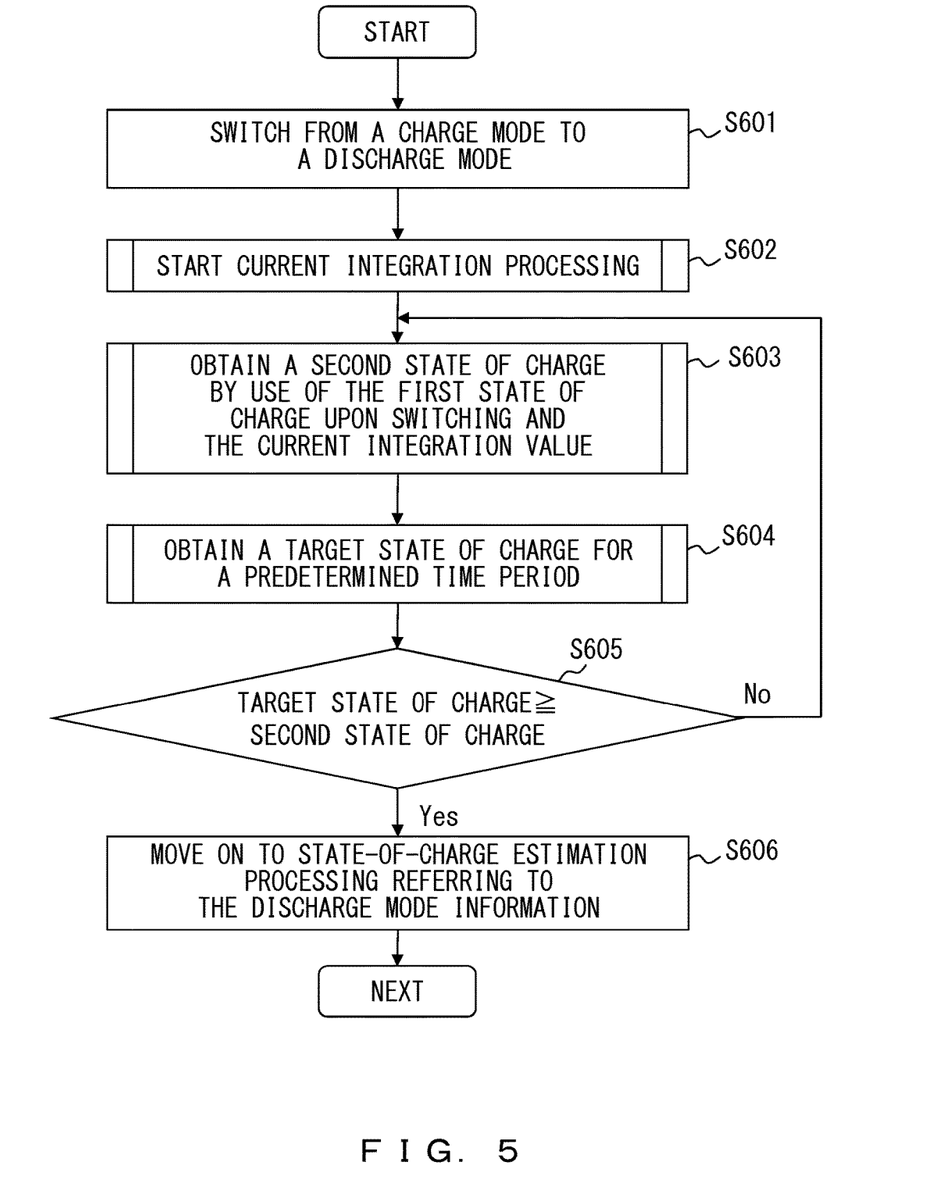
FIG. 5 is a flowchart which represents an example of an operation during transition from a charge mode to a discharge mode.

FIG. 5 is a flowchart which represents an example of an operation during transition from a charge mode to a discharge mode. In Step S601, the control unit 5 detects that a mode has been switched from a charge mode to a discharge mode.

In Step S602, the control unit 5 starts current integration processing by use of a current value obtained from the current measuring unit 3 so as to obtain a current integration value.

In Step S603, the control unit 5 obtains a second state of charge by use of the first state of charge upon switching and the current integration value.

In Step S604, the control unit 5 obtains a target state of charge associated with the current integration value obtained for a predetermined time period. The predetermined time period is set within a transition time period from the start to the end of the transition (a time period to transition from the start of the transition to the estimation of a state of charge by use of discharge mode information) and is shorter than the transition time period.

The order of Steps S603 and S604 is not restricted.

In Step S605, the control unit 5 determines whether the second state of charge is not greater than the target state of charge. The process goes to Step S606 when the second state of charge is not greater than the target state of charge (Yes), and the process goes to Step S603 when the second state of charge is greater than the target state of charge (No).

The process may repeat Step S605 without going to Step S603 when it is No in Step S605.

In Step S606, the control unit 5 moves on to state-of-charge estimation processing referring to the discharge mode information. Further, the current integration processing stops.

An operation of the control unit (operation of second processing) will now be described.

Figure 6:
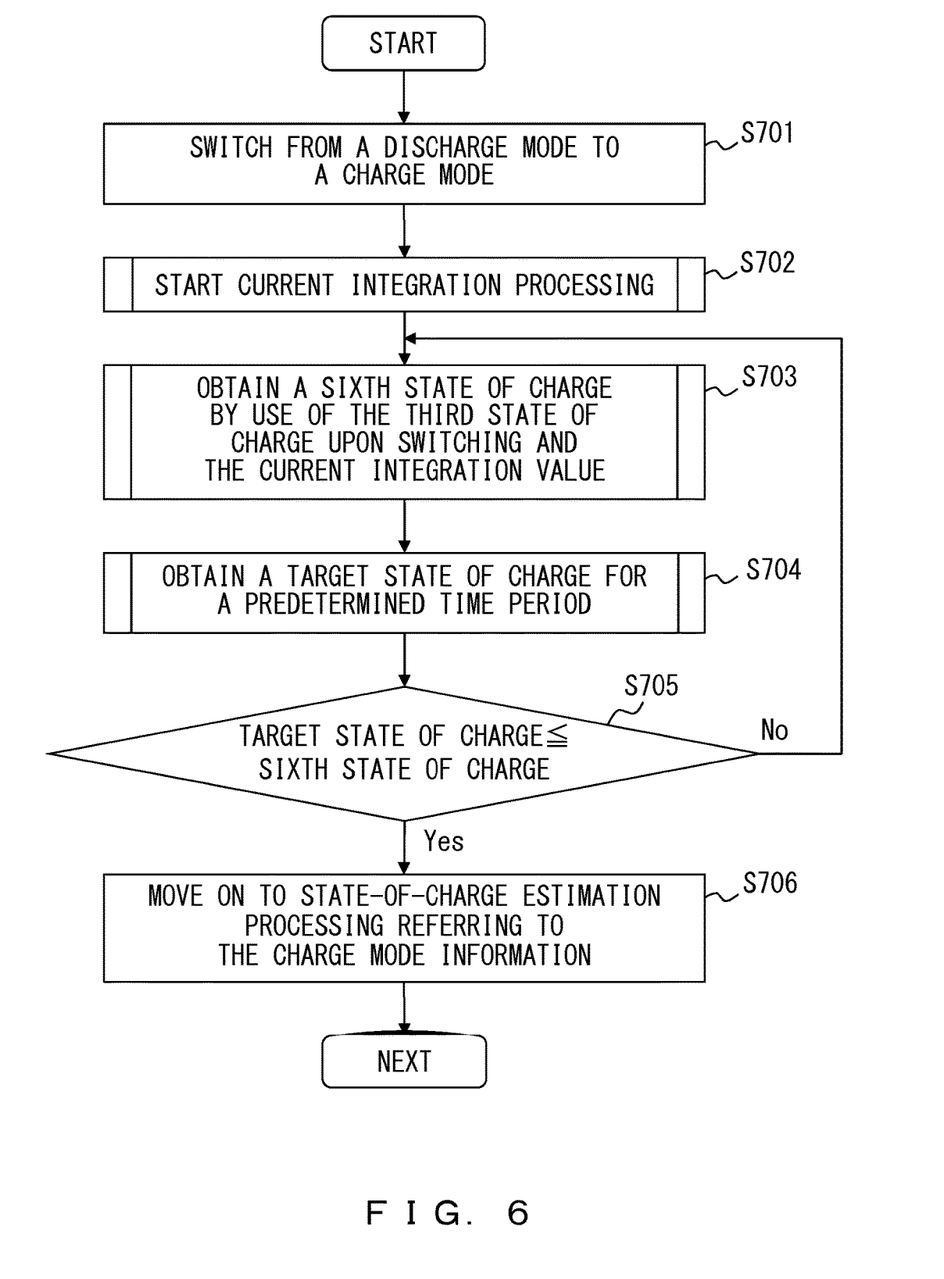
FIG. 6 is a flowchart which represents an example of an operation during transition from a discharge mode to a charge mode.

FIG. 6 is a flowchart which represents an example of an operation during transition from a discharge mode to a charge mode. In Step S701, the control unit 5 detects that a mode has been switched from a discharge mode to a charge mode.

In Step S702, the control unit 5 starts current integration processing by use of a current value obtained from the current measuring unit 3 so as to obtain a current integration value.

In Step S703, the control unit 5 obtains a sixth state of charge by use of the third state of charge upon switching and the current integration value.

In Step S704, the control unit 5 obtains a target state of charge associated with the current integration value obtained for a predetermined time period. The predetermined time period is set within a transition time period from the start to the end of the transition (a time period to transition from the start of the transition to the estimation of a state of charge by use of charge mode information) and is shorter than the transition time period.

The order of Steps S703 and S704 is not restricted.

In Step S705, the control unit 5 determines whether the sixth state of charge is not less than the target state of charge. The process goes to Step S706 when the sixth state of charge is not less than the target state of charge (Yes), and the process goes to Step S703 when the sixth state of charge is less than the target state of charge (No). The process may repeat Step S705 without going to Step S703 when it is No in Step S705.

In Step S706, the control unit 5 moves on to state-of-charge estimation processing referring to the charge mode information. Further, the current integration processing stops.

According to the first embodiment, an advantage is provided such that a state of charge in a battery is estimated accurately even if the state of charge is influenced by polarization.

Further, as illustrated in FIG. 2, when transitioning from a charge mode to a discharge mode, there is a voltage difference between a closed circuit voltage on the curve 302 that is represented by the charge mode information and a closed circuit voltage on the curve 303 that is represented by the discharge mode information. Thus, it is not possible to estimate a state of charge accurately when estimating the state of charge by use of the discharge mode information immediately after switching from a charge mode to a discharge mode. However, according to the first embodiment, an advantage is provided such that a state of charge is estimated accurately by estimating the state of charge during a transition time period from a charge mode to a discharge mode by use of a current integration.

Furthermore, as illustrated in FIG. 2, also when transitioning from a discharge mode to a charge mode, there is a voltage difference between a closed circuit voltage on the curve 303 that is represented by the discharge mode information and a closed circuit voltage on the curve 302 that is represented by the charge mode information. Thus, it is not possible to estimate a state of charge accurately when estimating the state of charge by use of the charge mode information immediately after switching from a discharge mode to a charge mode. However, according to the first embodiment, an advantage is provided such that a state of charge is estimated accurately by estimating the state of charge during a transition time period from a discharge mode to a charge mode by use of a current integration.

A second embodiment will now be described.

Processing when transitioning from a charge mode to a discharge mode (first processing) will now be described.

The first processor included in the transition estimation unit 10 according to the second embodiment obtains a discharge rate for each predetermined time period from the start of the transition during transition from a charge mode to a discharge mode. For example, when the predetermined time period is ten seconds, a discharge rate is obtained every ten seconds. In other words, a discharge rate from the start of the transition to ten seconds after the start of the transition, a discharge rate from ten to twenty seconds after the start of the transition, a discharge rate from twenty to thirty seconds after the start of the transition, . . . are obtained.

The transition estimation unit 10 refers, by use of the obtained discharge rate, to the discharge mode transition information that associates the discharge rate with a fourth state of charge ($\Delta$ SOC 1) to determine a target state of charge, so as to obtain the fourth state of charge. For example, the information 501 in FIG. 4 is used as discharge mode transition information. For example, when the predetermined time period is ten seconds, $\Delta$ SOC 1 associated with a discharge rate is obtained every ten seconds. In other words, $\Delta$ SOC 1 associated with a discharge rate from the start of the transition to ten seconds after the start of the transition, $\Delta$ SOC 1 associated with a discharge rate from ten to twenty seconds after the start of the transition, $\Delta$ SOC 1 associated with a discharge rate from twenty to thirty seconds after the start of the transition, . . . are obtained.

Further, the transition estimation unit 10 uses the fourth state of charge and the first state of charge at the start of the transition so as to obtain a target state of charge for each predetermined time period. For example, when the predetermined time period is ten seconds, a target state of charge is obtained every ten seconds by use of $\Delta$ SOC 1 associated with a discharge rate every ten seconds and the first state of charge at the start of the transition. In other words, a target state of charge from the start of the transition to ten seconds after the start of the transition is obtained by use of $\Delta$ SOC 1 associated with a discharge rate from the start of the transition to ten seconds after the start of the transition and the first state of charge at the start of the transition. Next, a target state of charge from ten to twenty seconds after the start of the transition is obtained by use of $\Delta$ SOC 1 associated with a discharge rate from ten to twenty seconds after the start of the transition and the first state of charge at the start of the transition. Then, a target state of charge from twenty to thirty seconds after the start of the transition is obtained by use of $\Delta$ SOC 1 associated with a discharge rate from twenty to thirty seconds after the start of the transition and the first state of charge at the start of the transition.

For example, when the first state of charge is 70[%] (SOC 1) and $\Delta$ SOC 1 associated with a discharge rate from the start of the transition to ten seconds after the start of the transition is 10[%], a target state of charge is 60[%]. Next, when $\Delta$ SOC 1 associated with a discharge rate from ten to twenty seconds after the start of the transition is 15[%], a target state of charge is 55[%]. Then, when $\Delta$ SOC 1 associated with a discharge rate from twenty to thirty seconds after the start of the transition is 5[%], a target state of charge is 65[%].

Further, the transition estimation unit 10 determines for each of the predetermined time periods whether the second state of charge is not greater than its target state of charge, and moves on to state-of-charge estimation processing referring to the discharge mode information when the second state of charge is not greater than its target state of charge.

Furthermore, the transition estimation unit 10 may use the fourth state of charge, the first state of charge at the start of the transition, and a difference between the first state of charge at the start of the transition and the second state of charge, so as to obtain a target state of charge for each predetermined time period.

For example, when the first state of charge is 70[%] (SOC 1), the second state of charge is 69[%], and $\Delta$ SOC 1 associated with a discharge rate from the start of the transition to ten seconds after the start of the transition is 10[%], a difference 1[%] between the first state of charge at the start of the transition and the second state of charge is first obtained. Then, $\Delta$ SOC 1 10[%] is subtracted from the first state of charge 70[%] and the difference 1[%] is added to the value obtained by the subtraction, so as to obtain a target state of charge 61[%].

Further, when the second state of charge from ten to twenty seconds after the start of the transition is 68[%] and $\Delta$ SOC 1 associated with a discharge rate is 15[%], $\Delta$ SOC 1 15[%] is subtracted from the first state of charge 70[%]. Then, a difference 2[%] between the first state of charge and the second state of charge is added to the value obtained by the subtraction so as to obtain a target state of charge 57[%].

Furthermore, when the second state of charge from twenty to thirty seconds after the start of the transition is 67[%] and $\Delta$ SOC 1 associated with a discharge rate is 5[%], $\Delta$ SOC 1 5[%] is subtracted from the first state of charge 70[%]. Then, a difference 3[%] between the first state of charge and the second state of charge is added to the value obtained by the subtraction so as to obtain a target state of charge 68[%].

The transition estimation unit 10 determines for each of the predetermined time periods whether the second state of charge is not greater than its target state of charge, and moves on to state-of-charge estimation processing referring to the discharge mode information when the second state of charge is not greater than its target state of charge.

Processing when transitioning from a discharge mode to a charge mode (second processing) will now be described.

The second processor included in the transition estimation unit 10 according to the second embodiment obtains a charge rate for each predetermined time period from the start of the transition during transition from a discharge mode to a charge mode. For example, when the predetermined time period is ten seconds, a charge rate is obtained every ten seconds. In other words, a charge rate from the start of the transition to ten seconds after the start of the transition, a charge rate from ten to twenty seconds after the start of the transition, a charge rate from twenty to thirty seconds after the start of the transition, . . . are obtained.

The transition estimation unit 10 refers, by use of the obtained charge rate, to the charge mode transition information that associates the charge rate with a fifth state of charge ($\Delta$ SOC 2) to determine a target state of charge, so as to obtain the fifth state of charge. For example, the information 501 in FIG. 4 is used as charge mode transition information. For example, when the predetermined time period is ten seconds, Δ SOC 2 associated with a charge rate is obtained every ten seconds. In other words, Δ SOC 2 associated with a charge rate from the start of the transition to ten seconds after the start of the transition, Δ SOC 2 associated with a charge rate from ten to twenty seconds after the start of the transition, Δ SOC 2 associated with a charge rate from twenty to thirty seconds after the start of the transition, . . . are obtained.

Further, the transition estimation unit 10 uses the fifth state of charge and the third state of charge at the start of the transition so as to obtain a target state of charge for each predetermined time period. For example, when the predetermined time period is ten seconds, a target state of charge is obtained every ten seconds by use of Δ SOC 2 associated with a charge rate every ten seconds and the third state of charge at the start of the transition. In other words, a target state of charge from the start of the transition to ten seconds after the start of the transition is obtained by use of Δ SOC 2 associated with a charge rate from the start of the transition to ten seconds after the start of the transition and the third state of charge at the start of the transition. Next, a target state of charge from ten to twenty seconds after the start of the transition is obtained by use of Δ SOC 2 associated with a charge rate from ten to twenty seconds after the start of the transition and the third state of charge at the start of the transition. Then, a target state of charge from twenty to thirty seconds after the start of the transition is obtained by use of Δ SOC 2 associated with a charge rate from twenty to thirty seconds after the start of the transition and the third state of charge at the start of the transition.

For example, when the third state of charge is 40[%] (SOC 3) and Δ SOC 2 associated with a charge rate from the start of the transition to ten seconds after the start of the transition is 10[%], a target state of charge is 50[%]. Next, when Δ SOC 2 associated with a charge rate from ten to twenty seconds after the start of the transition is 15[%], a target state of charge is 55[%]. Then, when Δ SOC 2 associated with a charge rate from twenty to thirty seconds after the start of the transition is 5[%], a target state of charge is 45[%].

Further, the transition estimation unit 10 determines for each of the predetermined time periods whether the sixth state of charge is equal to or greater than its target state of charge, and moves on to state-of-charge estimation processing referring to the charge mode information when the sixth state of charge is equal to or greater than its target state of charge.

Furthermore, the transition estimation unit 10 may use the fifth state of charge, the third state of charge at the start of the transition, and a difference between the third state of charge at the start of the transition and the sixth state of charge, so as to obtain a target state of charge for each predetermined time period.

For example, when the third state of charge is 40[%] (SOC 3), the sixth state of charge is 41[%], and Δ SOC 2 associated with a charge rate from the start of the transition to ten seconds after the start of the transition is 10[%], a difference 1[%] between the third state of charge at the start of the transition and the sixth state of charge is obtained. Then, Δ SOC 2 10[%] is added to the third state of charge 40[%] and the difference 1[%] is subtracted from the value obtained by the addition, so as to obtain a target state of charge 49[%].

Further, when the sixth state of charge from ten to twenty seconds after the start of the transition is 42[%] and Δ SOC 2 associated with a charge rate is 15[%], Δ SOC 2 15[%] is added to the third state of charge 40[%]. Then, a difference 2[%] between the third state of charge and the sixth state of charge is subtracted from the value obtained by the addition so as to obtain a target state of charge 53[%].

Furthermore, when the sixth state of charge from twenty to thirty seconds after the start of the transition is 43[%] and Δ SOC 2 associated with a charge rate is 5[%], Δ SOC 2 5[%] is added to the third state of charge 40[%]. Then, a difference 3[%] between the third state of charge and the sixth state of charge is subtracted from the value obtained by the addition so as to obtain a target state of charge 42[%].

Moreover, the transition estimation unit 10 determines for each of the predetermined time periods whether the sixth state of charge is equal to or greater than its target state of charge, and moves on to state-of-charge estimation processing referring to the charge mode information when the sixth state of charge is greater than its target state of charge.

According to the second embodiment, an advantage is provided such that a state of charge in a battery is estimated accurately even if the state of charge is influenced by polarization.

Further, as illustrated in FIG. 2, when transitioning from a charge mode to a discharge mode, there is a voltage difference between a closed circuit voltage on the curve 302 that is represented by the charge mode information and a closed circuit voltage on the curve 303 that is represented by the discharge mode information. Thus, it is not possible to estimate a state of charge accurately when estimating the state of charge by use of the discharge mode information immediately after switching from a charge mode to a discharge mode. However, according to the second embodiment, an advantage is provided such that a state of charge is estimated accurately by estimating the state of charge during a transition time period from a charge mode to a discharge mode by use of a current integration.

Furthermore, as illustrated in FIG. 2, also when transitioning from a discharge mode to a charge mode, there is a voltage difference between a closed circuit voltage on the curve 303 that is represented by the discharge mode information and a closed circuit voltage on the curve 302 that is represented by the charge mode information. Thus, it is not possible to estimate a state of charge accurately when estimating the state of charge by use of the charge mode information immediately after switching from a discharge mode to a charge mode. However, according to the second embodiment, an advantage is provided such that a state of charge is estimated accurately by estimating the state of charge during a transition time period from a discharge mode to a charge mode by use of a current integration.

Moreover, an advantage is provided such that a state of charge is estimated accurately even if a vehicle stops or speeds up because a target state of charge is determined for each predetermined time period.

The present invention is not limited to the first and second embodiments, and various modifications and alterations may be made thereto without departing from the spirit and scope of the invention.

What is claimed is:
1. A state-of-charge estimation device for estimating the state-of-charge of a battery in a vehicle, the state-of-charge estimation device comprising:
   a voltmeter that measures a voltage in the battery;
   an ammeter that measures a current charged to and discharged from the battery;

a plurality of switches operable to connect the battery to a load in a discharged state during vehicle operation, and operable to connect the battery to a charger in a charged state;

a memory that stores charge mode information that associates a closed circuit voltage with a charging state-of-charge in the battery when charging is performed by a charger, and discharge mode information that associates a discharging state-of-charge with a closed circuit voltage that is generated by use of a discharge pattern of the battery obtained by operating the vehicle in a predetermined operation pattern, the closed circuit voltage having a potential difference from a closed circuit voltage corresponding to the charging state-of-charge of the charge mode information achieved when the battery starts transition from the charged state to the discharged state; and a central processing unit (CPU) connected to the memory and that, when the battery is in the charged state, performs state-of-charge estimation by using the closed circuit voltage and the charge mode information, refers to the charge mode information by use of a measured closed circuit voltage when the battery is in the charged state, and obtains the charging state-of-charge, so as to define the charging state-of-charge as a state-of-charge upon charging;

after the battery has transitioned from the charged state to the discharged state, changes from state-of charge estimation by using the closed circuit voltage and charge mode information to using current integration, starts current integration by use of the measured current, obtains a transition state-of-charge by use of the charging state-of-charge at the start of the transition and a current integration value, wherein the transition state-of-charge at the start of transition is different from a target state-of-charge, obtains the target state-of-charge determined by the charging state-of-charge at the start of the transition and a current integration value obtained for a predetermined time period after the start of the transition, compares the transition state-of-charge and the target state-of-charge, decides whether the transition state-of-charge is less than the target state-of-charge, and defines the transition state-of-charge as a state-of-charge upon discharging when the transition state-of-charge is greater than the target state-of-charge; and after the transition state-of-charge has become less than the target state-of-charge, changes from state-of-charge estimation, using current integration, to using the closed circuit voltage and discharge mode information, refers to the discharge mode information by use of the closed circuit voltage measured upon discharging, and obtains the discharging state-of-charge, so as to define the discharging state-of-charge as a state-of-charge upon discharging.

2. The state-of-charge estimation device according to claim 1, wherein the central processing unit (CPU) obtains a discharge rate for a predetermined time period after the start of the transition, refers to a discharge mode transition information that associates the discharge rate with a delta state-of-charge to determine the target state-of-charge by use of the discharge rate, so as to obtain the delta state-of-charge, and subtracts the delta state-of-charge from the charging state-of-charge at the start of the transition, so as to obtain the target state-of-charge, and the discharge rate is a value obtained by dividing a current integration value of a current discharged over one hour by a full capacity of the battery, the current integration value of a current discharged over one hour being estimated by using a current integration value obtained for a predetermined time period after the start of the transition.

3. The state-of-charge estimation device according to claim 2, wherein the central processing unit (CPU)

obtains a second discharging rate for a second predetermined time period that follows the predetermined time period after the start of the transition, refers to the discharge mode transition information that associates the second discharging rate with the delta state-of-charge to determine the target state-of-charge by use of the second discharging rate, so as to obtain the delta state-of-charge, and subtracts the delta state-of-charge from the charging state-of-charge at the start of the transition, so as to obtain the target state-of-charge, and the second discharging rate is a value obtained by dividing a current integration value of a current discharged over one hour by a full capacity of the battery, the current integration value of a current discharged over one hour being estimated using a current integration value obtained for the second predetermined time period.

4. The state-of-charge estimation device according to claim 3, wherein the central processing unit (CPU) uses a value obtained by subtracting the delta state-of-charge from the charging state-of-charge at the start of the transition, and a difference between the charging state-of-charge at the start of the transition and the transition state-of-charge, so as to obtain the target state-of-charge for each of the predetermined time periods.

5. A state-of-charge estimation device for estimating the state-of-charge of a battery in a vehicle, the state-of-charge estimation device comprising:

a voltmeter that measures a voltage in the battery;

an ammeter that measures a current charged to and discharged from the battery;

a plurality of switches operable to connect the battery to a load in a discharged state during vehicle operation, and operable to connect the battery to a charger in a charged state;

a memory that stores charge mode information that associates a closed circuit voltage with a charging state-of-charge in the battery when charging is performed by a charger, and discharge mode information that associates a discharging state-of-charge with a closed circuit voltage that is generated by use of a discharge pattern of the battery obtained by operating the vehicle in a predetermined operation pattern, the closed circuit voltage having a potential difference from a closed circuit voltage corresponding to the charging state-of-charge of the charge mode information achieved when the battery starts transition from the discharged state to the charged state; and a central processing unit (CPU) connected to the memory and that, when the battery is in the discharged state, performs state-of-charge estimation by using the closed circuit voltage and the discharge mode information, refers to the discharge mode information by use of a measured closed circuit voltage when the battery is in the discharged state, and obtains the discharging state-of-charge, so as to define the discharging state-of-charge as a state-of-charge upon discharging;

after the battery has transitioned from the discharged state to the charged state, changes from state-of-charge estimation by using the closed circuit voltage and discharge mode information to using current integration, starts current integration by use of the measured current, obtains a transition state-of-charge by use of the discharging state-of-charge at the start of the transition and a current integration value, wherein the transition state-of-charge at a start of the transition is different from a target state-of-charge, obtains the target state-of-charge determined by the discharging state-of-charge at the start of the transition and a current integration value obtained for a predetermined time period after the start of the transition, compares the transition state-of-charge and the target state-of-charge, decides whether the transition state-of-charge is greater than the target state-of-charge, and defines the transition state-of-charge as a state-of-charge upon charging when the transition state-of-charge is less than the target state-of-charge; and after the transition state-of-charge has become greater than the target state-of-charge, changes from state-of-charge estimation, using current integration, to using the closed circuit voltage and charging mode information, refers to the charge mode information, by use of the closed circuit voltage measured upon charging, and obtains the charging state-of-charge, so as to define the charging state-of-charge as a state-of-charge upon charging.

6. The state-of-charge estimation device according to claim 5,
wherein the central processing unit (CPU) obtains a charge rate for a predetermined time period after the start of the transition,
refers, by use of the charge rate, to a charge mode transition information that associates the charge rate with a delta state-of-charge to determine the target state-of-charge, so as to obtain the delta state-of-charge, and
adds the delta state-of-charge to the discharging state-of-charge at the start of the transition, so as to obtain the target state-of-charge.

7. The state-of-charge estimation device according to claim 5,
wherein the central processing unit (CPU) obtains a charge rate for each predetermined time period after the start of the transition,
refers, by use of the charge rate, to a charge mode transition information that associates the charge rate with a delta state-of-charge to determine the target state-of-charge, so as to obtain the delta state-of-charge, and
adds the delta state-of-charge to the discharging state-of-charge at the start of the transition, so as to obtain the target state-of-charge for each of the predetermined time periods.

8. The state-of-charge estimation device according to claim 7,
wherein the central processing (CPU) uses a value obtained by adding the delta state-of-charge to the discharging state-of-charge at the start of the transition, and a difference between the discharging state-of-charge at the start of the transition and the transition state-of-charge, so as to obtain the target state-of-charge for each of the predetermined time periods.

9. A state-of-charge estimation method executable by a computer for estimating the state-of-charge of a battery in a vehicle, the method comprising:
measuring, with a voltmeter, a voltage in the battery;
measuring, with an ammeter, a current charged to and discharged from the battery;
providing a plurality of switches that connects the battery to a load in a discharged state during vehicle operation, and connects the battery to a charger in a charged state;
storing, in a memory, charge mode information that associates a closed circuit voltage with a charging state-of-charge in the battery when charging is performed by a charger, and discharge mode information that associates a discharging state-of-charge with a closed circuit voltage that is generated by use of a discharge pattern of the battery obtained by operating the vehicle in a predetermined operation pattern, the closed circuit voltage having a potential difference from a closed circuit voltage corresponding to the charging state-of-charge of the charge mode information achieved when the battery starts transition from the charged stated to the discharged state;
when the battery is in a charged state, a central processing unit (CPU) connected to the memory performs state-of-charge estimation using the closed circuit voltage and the charge mode information,
refers to the charge mode information by use of a measured closed circuit voltage when the battery is in the charged state, and obtains the charging state-of-charge, so as to define the charging state-of-charge as a state-of-charge upon charging;

after the battery has transitioned from the charged state to the discharged state, changes from the state-of-charge estimation by using the closed circuit voltage and charge mode information to using current integration, starts current integration by use of the measured current, and obtains a transition state-of-charge by use of the charging state-of-charge at the start of the transition and a current integration value, wherein the transition state-of-charge at a start of the transition is different from a target state-of-charge;

obtains the target state-of-charge determined by the charging state-of-charge at the start of the transition and a current integration value obtained for a predetermined time period after the start of the transition;

compares the transition state-of-charge and the target state-of-charge;

decides whether the transition state-of-charge is less than the target state-of-charge, and defines the transition state-of-charge as a state-of-charge upon discharging when the transition state-of-charge is greater that the target state-of-charge; and after the transition state-of-charge has become less than the target state-of-charge, changes from state-of-charge estimation, using current integration, to using the closed circuit voltage and discharge mode information, refers to the discharge mode information by use of the closed circuit voltage measured upon discharging, and obtains the discharging state-of-charge, so as to define the discharging state-of-charge as a state-of-charge upon discharging.

10. A state-of-charge estimation method executable by a computer for estimating the state-of-charge of a battery in a vehicle, the method comprising:

measuring, with a voltmeter, a voltage in the battery;
measuring, with an ammeter, a current charged to and discharged from the battery;
providing a plurality of switches that connects the battery to a load in a discharged state during vehicle operation, and connects the battery to a charger in a charged state;
storing, in a memory, charge mode information that associates a closed circuit voltage with a charging state-of-charge in the battery when charging is performed by a charger, and discharge mode information that associates a discharging state-of-charge with a closed circuit voltage that is generated by use of a discharge pattern of the battery obtained by operating the vehicle in a predetermined operation pattern, the closed circuit voltage having a potential difference from a closed circuit voltage corresponding to the charging state-of-charge of the charge mode information achieved when the battery start transition from a discharged state to a charged state;
when the battery is in a charged state, a central processing unit (CPU) connected to the memory performs state-of-charge estimation using the closed circuit voltage and the discharge mode information,
refers to the discharge mode information by use of a measured closed circuit voltage when the battery is in the discharged state, and obtaining the discharging state-of-charge, so as to define the discharging state-of-charge as a state-of-charge upon discharging;
after the battery has transitioned from the discharged state to the charged state, changes from the state-of-charge estimation by using the closed circuit voltage and discharge mode information to using current integration, starts current integration by use of the measured current, and obtains a transition state-of-charge by use of the discharging state-of-charge at the start of the transition and a current integration value, wherein the transition state-of-charge at a start of the transition is different from a target state-of-charge;
obtains the target state of charge determined by the discharging state-of-charge at the start of the transition and a current integration value obtained for a predetermined time period after the start of transition;
compares the transition state-of-charge and the target state-of-charge;
decides whether the transition state-of-charge is greater than the target state of charge, and defines the transition state-of-charge as a state-of-charge upon charging when the transition state-of-charge is less than the target state-of-charge; and
after the transition state-of-charge has become greater than the target state-of-charge, changes from state-of-charge estimation, using current integration, to using the closed circuit voltage and charge mode information, refers to the charge mode information by use of the closed circuit voltage measured upon charging, and obtains the first state-of-charge, so as to define the charging state-of-charge as a state-of-charge upon charging.

\* \* \* \* \*